(12) United States Patent
Ma et al.

(10) Patent No.: US 9,418,983 B2
(45) Date of Patent: Aug. 16, 2016

(54) SEMICONDUCTOR DEVICE AND ASSOCIATED METHOD FOR MANUFACTURING

(71) Applicant: Chengdu Monolithic Power Systems Co., Ltd., Chengdu (CN)

(72) Inventors: Rongyao Ma, Chengdu (CN); Tiesheng Li, San Jose, CA (US)

(73) Assignee: CHENGDU MONOLITHIC POWER SYSTEMS CO., LTD., Chengdu (CN)

( * ) Notice: Subject to any disclaimer, the term of this patent is extended or adjusted under 35 U.S.C. 154(b) by 137 days.

(21) Appl. No.: 14/134,463

(22) Filed: Dec. 19, 2013

(65) Prior Publication Data

US 2014/0183627 A1 Jul. 3, 2014

(30) Foreign Application Priority Data

Dec. 19, 2012 (CN) .......................... 2012 1 0553316

(51) Int. Cl.
| | | |
|---|---|---|
| *H01L 29/78* | (2006.01) | |
| *H01L 27/02* | (2006.01) | |
| *H01L 29/423* | (2006.01) | |
| *H01L 29/66* | (2006.01) | |

(52) U.S. Cl.
CPC ........ *H01L 27/0296* (2013.01); *H01L 27/0255* (2013.01); *H01L 29/4238* (2013.01); *H01L 29/66727* (2013.01); *H01L 29/66734* (2013.01); *H01L 29/781* (2013.01); *H01L 29/7808* (2013.01); *H01L 29/7813* (2013.01)

(58) Field of Classification Search
CPC ............ H01L 27/0255; H01L 29/7801; H01L 29/7803; H01L 29/7808; H01L 29/66674
See application file for complete search history.

(56) References Cited

U.S. PATENT DOCUMENTS

| | | | | |
|---|---|---|---|---|
| 7,585,705 B2 * | 9/2009 | Pan | ..................... | H01L 27/0255 257/173 |
| 2010/0289073 A1 * | 11/2010 | Hsieh | .................. | H01L 27/0255 257/328 |
| 2013/0001695 A1 * | 1/2013 | Guan | .................. | H01L 27/0814 257/355 |
| 2013/0092976 A1 * | 4/2013 | Hsieh | .................. | H01L 27/0629 257/133 |

* cited by examiner

*Primary Examiner* — Allen Parker
*Assistant Examiner* — Stephen Bradley
(74) *Attorney, Agent, or Firm* — Perkins Coie LLP

(57) ABSTRACT

A semiconductor device having an ESD protection structure and a method for forming the semiconductor device. The ESD protection structure is formed atop a termination area of the substrate and is electrically coupled between a source metal and a gate metal of the semiconductor device. The ESD protection structure has a first portion adjacent to the source metal, a second portion adjacent to the gate metal and a middle portion between and connecting the first portion and the second portion, wherein the middle portion has a first thickness greater than a second thickness of the first portion and the second portion. Such an ESD protection structure is beneficial to the formation of interlayer vias which are formed to couple the ESD protection structure to the source metal and the gate metal.

9 Claims, 14 Drawing Sheets

SEMICONDUCTOR DEVICE AND ASSOCIATED METHOD FOR MANUFACTURING

CROSS-REFERENCE TO RELATED APPLICATION(S)

This application claims the benefit of CN application No. 201210553316.4 filed on Dec. 19, 2012 and incorporated herein by reference.

TECHNICAL FIELD

This disclosure relates generally to semiconductor devices, and more particularly but not exclusively relates to semiconductor devices having an ESD protection structure.

BACKGROUND

Semiconductor devices, such as metal oxide semiconductor field effect transistors ("MOSFETs"), junction field effect transistors ("JFETs"), and double diffused metal-oxide semiconductor (DMOS) transistors etc. are widely used in various electronic products. Generally, to protect a gate oxide of such a semiconductor device from being damaged by electro-static discharge ("ESD"), an ESD protection module is coupled between a gate and a source of the semiconductor device. The ESD protection module is configured to provide a conduction path between the source and the gate of the semiconductor device, once a gate to source voltage of the semiconductor device caused by ESD exceeds an ESD threshold voltage, so that a large extra energy due to ESD can be discharged promptly through the conduction path. The ESD protection module is usually desired to be integrated into the semiconductor device that it is intended to protect for reducing the size and manufacturing cost of the semiconductor device.

FIG. 1A illustrates schematically a cross-sectional view of a typical semiconductor device 10 having a power transistor such as MOSFET 11 and an ESD protection module 12 integrated together. FIG. 1B illustrates a top plan view of the semiconductor device 10. The cross-sectional view in FIG. 1A can be considered as being cut from the cut line AA' in FIG. 1B. As shown in FIG. 1A, the semiconductor device 10 is formed on a substrate 13 having an active area $10_1$ and a termination area $10_2$ (also referring to FIG. 1B). The MOSFET 11 is formed in the active area $10_1$ of the substrate 13 and may comprise a gate region 15, a source region 16 and a drain region, wherein the drain region comprises a portion of the substrate 13 near the bottom surface S of the substrate 13. In FIG. 1A, the gate region 15 is illustrated as a trenched gate region electrically coupled to a gate metal 17 through a trenched gate runner $15_T$ and a first interlayer via $22_1$. The trenched gate runner $15_T$ has a same structure as the trenched gate region 15 but with wider trench width to facilitate formation of the via $22_1$. The electrical connection of the gate region 15 to the trenched gate runner $15_T$ is illustrated by a dotted line in FIG. 1A. The source region 16 is electrically coupled to a source metal 18 through a second interlayer via $22_2$.

The ESD protection module 12 is formed on a thick isolation layer 21 atop the termination area $10_2$ of the substrate 13, wherein the thick isolation layer 21 electrically isolates the ESD protection module 12 from the substrate 13. Typically, the ESD protection module 12 may comprise a group of PN diodes formed by depositing a polysilicon layer 19 atop the thick isolation layer 21, and subsequently doping the polysilicon layer 19 with P type and N type dopants. The ESD protection module 12 (i.e. the group of PN diodes formed by the alternately arranged P type doped regions and N type doped regions) is electrically coupled between the source metal 18 and the gate metal 17 to protect a gate oxide of gate region 15 from being damaged by a large extra energy due to ESD. The source metal 18 and the gate metal 17 can be electrically coupled to the ESD protection module 12 respectively through a third interlayer via $22_3$ and a fourth interlayer via $22_4$.

Now referring to FIG. 1B, the gate metal 17 is formed around the source metal 18 and is normally disposed above the termination area $10_2$ of the substrate 13. The gate metal 17 has a gate metal pad $17_1$ and a gate metal runner $17_2$. Turning back to FIG. 1A, an interlayer dielectric (ILD) layer 20 is normally formed between the metal layer (including the gate metal 17 and the source metal 18) and the substrate 13 and the ESD protection module 12 to isolate the gate metal 17 and the source metal 18 from the substrate 13 and the polysilicon layer 19 of the ESD protection module 12. The first interlayer via $22_1$, the second interlayer via $22_2$, the third interlayer via $22_3$ and the fourth interlayer via $22_4$ are formed through the ILD layer 20 and filled with conductive material. However, the first interlayer via $22_1$ is generally formed only under the gate metal runner $17_2$ but not under the gate metal pad $17_1$ since the ESD protection module 12 is disposed under the gate metal pad $17_1$, which makes it rather difficult to form an interlayer via from the gate metal pad $17_1$ through the ILD layer 20, the polysilicon layer 19 and the thick isolation layer 21 to reach the substrate 13. Therefore, the gate metal pad $17_1$ can not be electrically coupled to the gate region 15 through structures like the first interlayer via $22_1$ and the trenched gate runner $15_T$, which adversely affects the electrical conductivity between the gate region 15 and the gate metal 17.

Moreover, since the ESD protection module 12 (including the polysilicon layer 19 and the thick isolation layer 21) has a great thickness (measured in the direction perpendicular with the bottom surface S of the substrate 13), there exists a large transition step 23 from the top surface of the MOSFET 11 to the top surface of the ESD protection module 12. This large difference in height between the top surface of the MOSFET 11 and the top surface of the ESD protection module 12 renders a problem for forming the interlayer vias $22_1$, $22_2$, $22_3$ and $22_4$. It is generally desired to form these interlayer vias in a same step to simplify manufacturing process and save cost. However, for the semiconductor device 10 in FIG. 1A, the third interlayer via $22_3$ and the fourth interlayer via $22_4$ which are located on a higher position (at top of the transition step 23) can hardly be formed in the same step for forming the first interlayer via $22_1$ and the second interlayer via $22_2$ which are located on a lower position (at foot of the transition step 23). For example, when the interlayer vias $22_1$, $22_2$, $22_3$ and $22_4$ are formed by etching the ILD layer 20 with the shield of a patterned photoresist layer in a same step, patterning of the photoresist layer may be greatly affected by the large transition step 23 under a given focal depth. If the patterns defining the first and the second interlayer vias $22_1$ and $22_2$ are focused, the patterns defining the third and the fourth interlayer vias $22_3$ and $22_4$ may be out of focus. Thus, the third and the fourth interlayer vias $22_3$ and $22_4$ may not be precisely formed as required or even can not be opened, especially when the required critically dimension of the vias is small.

SUMMARY

In accomplishing the above and other objects, there has been provided, in accordance with an embodiment of the present disclosure, a semiconductor device. The semiconductor device comprises: a semiconductor substrate of a first conductivity type and having an active cell area and a termination area; a semiconductor transistor, formed in the active cell area and having a drain region, a gate region, and a source region; a source metal, formed over the active cell area of the substrate and electrically coupled to the source region; a gate metal, formed over the termination area of the substrate and electrically coupled to the gate region, wherein the gate metal is formed around the source metal and is separated from the source metal with a gap; and an ESD protection structure, formed atop the termination area of the semiconductor substrate and disposed substantially between the source metal and the gate metal, wherein the ESD protection structure comprises a first isolation layer and an ESD protection layer, and wherein the first isolation layer is disposed between the ESD protection layer and the substrate to isolate the ESD protection layer from the substrate; and wherein the ESD protection structure has a first portion adjacent to the source metal, a second portion adjacent to the gate metal and a middle portion between and connecting the first portion and the second portion, and wherein the middle portion has a first thickness greater than a second thickness of the first portion and the second portion.

There has been further provided, in accordance with an embodiment of the present disclosure, a method for forming a semiconductor device having a semiconductor transistor and an ESD protection structure. The method comprises: providing a semiconductor substrate having a first conductivity type, wherein the substrate has a top surface and includes an active cell area and a termination area that are respectively designated for forming the semiconductor transistor and the ESD protection structure; forming the semiconductor transistor in the active cell area, wherein forming the semiconductor transistor comprises forming a drain region, a gate region and a source region; forming the ESD protection structure atop the top surface of the substrate over the termination area; forming a source metal over the active cell area of the substrate; and forming a gate metal over the termination area of the substrate around the source metal and separated from the source metal with a gap; wherein forming the ESD protection structure comprises: forming a patterned first isolation layer atop the top surface of the substrate over the termination area, wherein the patterned first isolation layer includes a first thin isolation portion, a second thin isolation portion and a thick middle isolation portion between and connecting the first thin isolation layer and the second thin isolation layer; and forming a patterned ESD protection layer atop the patterned first isolation layer so that the patterned first isolation layer and the patterned ESD protection layer in entirety has a first portion, a second portion and a middle portion between and connecting the first portion and the second portion, wherein the middle portion has a thickness greater than that of the first portion and the second portion.

There has been further provided, in accordance with an embodiment of the present disclosure, a method for forming a semiconductor device having an ESD protection structure. The method comprises: providing a semiconductor substrate having a first conductivity type, wherein the substrate has a top surface and includes an active cell area and a termination area that are respectively designated for forming a semiconductor transistor and the ESD protection structure; forming a trenched gate region in the active cell area and forming a trenched gate contact in the termination area; forming a first isolation layer atop the entire top surface of the substrate and patterning the first isolation layer to form a patterned first isolation layer, wherein the patterned first isolation layer includes a first thin isolation portion, a second thin isolation portion and a thick middle isolation portion between and connecting the first thin isolation layer and the second thin isolation layer, and wherein the thick middle isolation portion has a greater thickness than the first thin isolation layer and the second thin isolation layer; forming an ESD polysilicon layer atop the substrate and the patterned first isolation layer; doping the ESD polysilicon layer with dopants of a second conductivity type opposite to the first conductivity type; patterning the ESD polysilicon layer so that a designed patterned portion of the ESD polysilicon layer remains and overlies the patterned first isolation layer, and that the patterned first isolation layer and the patterned ESD polysilicon layer in entirety has a first portion, a second portion and a middle portion between and connecting the first portion and the second portion, wherein the middle portion has a thickness greater than that of the first portion and the second portion; and doping the patterned ESD polysilicon layer with dopants of the first conductivity type so that the patterned ESD polysilicon layer includes a plurality of alternately arranged first-conductivity-type doped zones and second-conductivity-type doped zones; and forming a source metal over the active cell area of the substrate, and forming a gate metal over the termination area of the substrate around the source metal and separated from the source metal with a gap; and wherein the patterned first isolation layer and the patterned ESD polysilicon layer are substantially located between the source metal and the gate metal, and wherein the first portion is adjacent to the source metal and the second portion is adjacent to the gate metal.

BRIEF DESCRIPTION OF THE DRAWINGS

The following detailed description of various embodiments of the present invention can best be understood when read in conjunction with the following drawings, in which the features are not necessarily drawn to scale but rather are drawn as to best illustrate the pertinent features.

The use of the same reference label in different drawings indicates the same or like components or structures with substantially the same functions for the sake of simplicity.

DETAILED DESCRIPTION

Various embodiments of the present invention will now be described. In the following description, some specific details, such as example circuits and example values for these circuit components, are included to provide a thorough understanding of embodiments. One skilled in the relevant art will recognize, however, that the present invention can be practiced without one or more specific details, or with other methods, components, materials, etc. In other instances, well-known structures, materials, processes or operations are not shown or described in detail to avoid obscuring aspects of the present invention.

Throughout the specification and claims, the terms "left," "right," "in," "out," "front," "back," "up," "down," "top," "atop", "bottom," "over," "under," "above," "below" and the like, if any, are used for descriptive purposes and not necessarily for describing permanent relative positions. It is to be understood that the terms so used are interchangeable under appropriate circumstances such that embodiments of the technology described herein are, for example, capable of operation in other orientations than those illustrated or otherwise described herein. The term "coupled," as used herein, is defined as directly or indirectly connected in an electrical or non-electrical manner. The terms "a," "an," and "the" includes plural reference, and the term "in" includes "in" and "on". The phrase "in one embodiment," as used herein does not necessarily refer to the same embodiment, although it may. The term "or" is an inclusive "or" operator, and is equivalent to the term "and/or" herein, unless the context clearly dictates otherwise. Where either a field effect transistor ("FET") or a bipolar junction transistor ("BJT") may be employed as an embodiment of a transistor, the scope of the words "gate", "drain", and "source" includes "base", "collector", and "emitter", respectively, and vice versa. The symbols "+" and "−" when used to describe dopants or doped regions/zones are merely used to descriptively indicate relative dopant concentration levels, but not intend to specify or limit the dopant concentration ranges, nor intend to add other limitations to the dopants and doped regions/zones. For instance, both "N+ type" and "N− type" can be referred to as "N type" in more general terms, and both "P+ type" and "P− type" can be referred to as "P type" in more general terms. Those skilled in the art should understand that the meanings of the terms identified above do not necessarily limit the terms, but merely provide illustrative examples for the terms.

Figure 2:
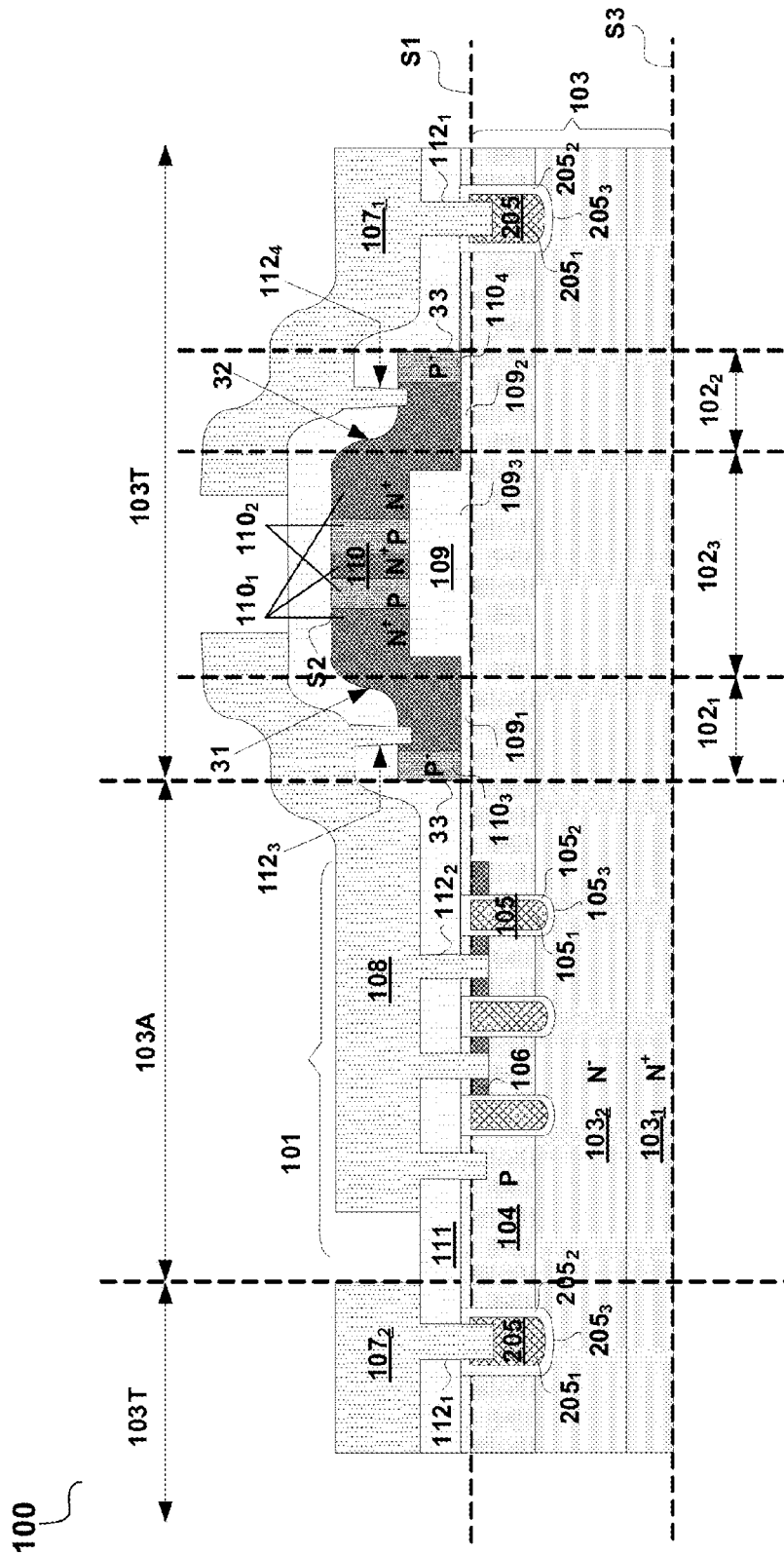
FIG. 2 illustrates a cross-sectional view of a semiconductor device 100 in accordance with an exemplary embodiment of the present invention.
Figure 3:
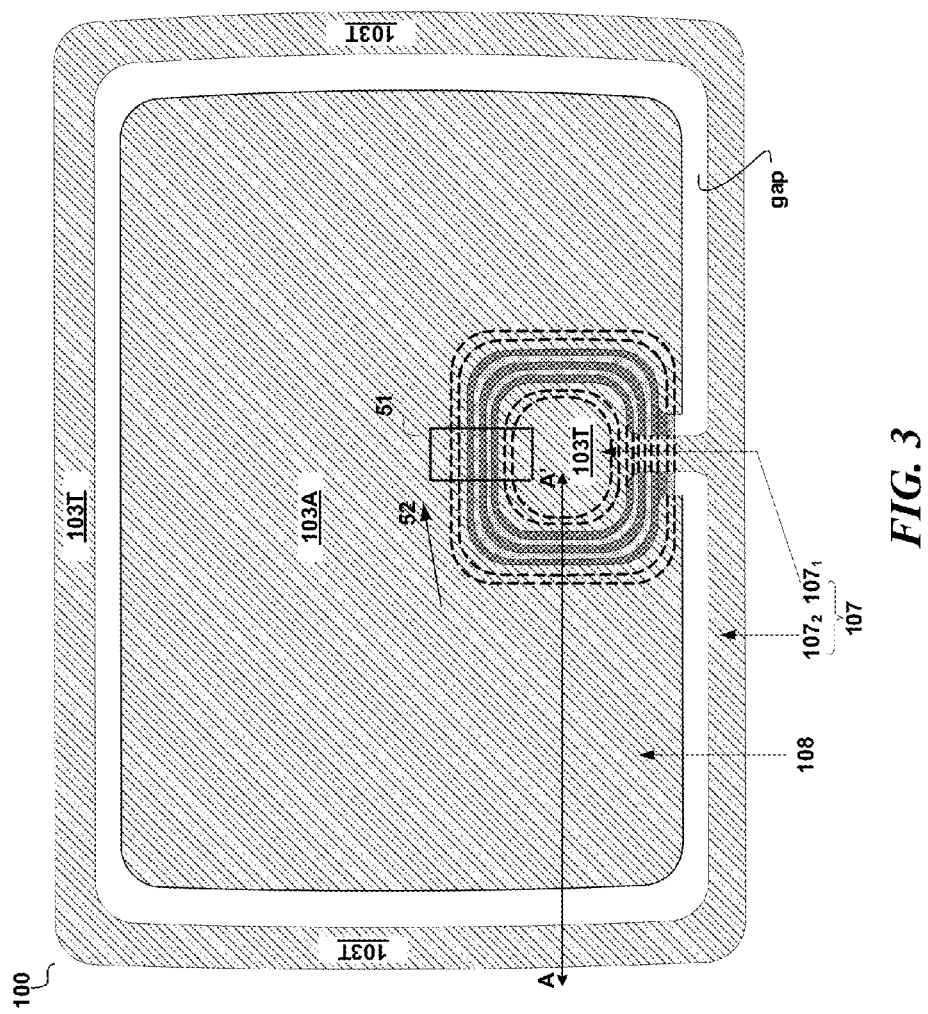
FIG. 3 illustrates a top plan view of the semiconductor device 100 in accordance with an exemplary embodiment of the present invention.

FIG. 2 illustrates a cross-sectional view of a semiconductor device 100 in accordance with an exemplary embodiment of the present invention. FIG. 3 illustrates a top plan view of the semiconductor device 100 in accordance with an exemplary embodiment of the present invention. In accordance with an embodiment of the present invention, the semiconductor device 100 may comprise a semiconductor transistor 101 (e.g. illustrated in FIG. 2 as a MOSFET at the left side of the device 100) and an electro-static discharge ("ESD") protection structure 102 (e.g. illustrated in FIG. 2 at the right side of the device 100). It should be noted that FIG. 3 illustrates a top plan view of the whole die of semiconductor device 100 with only the metal layer and polysilicon layer of the ESD protection structure 102 shown, while FIG. 2 illustrates a cross-sectional view of only portions of the semiconductor device 100. For example, it can be understood that the cross-sectional view of FIG. 2 corresponds to the portion cut from the cut line AA' in FIG. 3. However, it should also be understood that the corresponding relationship between the cross-sectional view and the top plan view of the semiconductor device 100 illustrated in FIG. 2 and FIG. 3 are not intended to be limiting.

In the exemplary embodiment shown in FIG. 2, the semiconductor device 100 has a substrate 103 of a first conductivity type (e.g. illustrated as N type in FIG. 2). The substrate 103 may comprise a relatively heavy doped substrate layer $103_1$ (e.g. illustrated as an N+ substrate layer in FIG. 2) and a relatively light doped epitaxial layer $103_2$ (e.g. illustrated as an N− epitaxial layer in FIG. 2) formed on the substrate layer $103_1$. That is to say, the substrate layer $103_1$ has a larger dopant concentration than the epitaxial layer $103_2$. However, this is not intended to be limiting, in other embodiments, the substrate 103 may comprise doped silicon (Si), Silicon-Germanium (SiGe), Silicon on insulator (SOI) and/or any other suitable semiconductor materials. The substrate 103 may have an active cell area 103A and a termination area 103T (also referring to FIG. 3). It should be noted that in the embodiments illustrated in FIGS. 2 and 3, the boundaries, indicated with the vertical dotted line and double-head arrow lines, between the active cell area 103A and the termination area 103T are illustrative and approximate rather than limiting and absolute. In an embodiment, the semiconductor transistor 101 is formed in the active cell area 103A and the ESD protection structure 102 is formed in the termination area 103T.

In accordance with an embodiment of the present invention, the semiconductor transistor 101 may comprise a drain region (103), a gate region 105, and a source region 106. In the example of FIG. 2, the heavy doped substrate layer $103_1$ functions as the drain region of the semiconductor transistor 101, and the light doped epitaxial layer $103_2$ functions as a drift region. The source region 106 is located laterally adjacent to both sides (left side/a first side and right side/a second side opposite to the first side) of the gate region 105, and may have the first conductivity type with a relatively heavy dopant concentration, e.g. heavier than the dopant concentration of the epitaxial layer $103_2$. For instance, in FIG. 2, the source region 106 is exemplarily illustrated as an N+ type doped region, and may have a dopant concentration higher than $1 \times 10^{19}$ cm$^{-3}$, while the N− type doped epitaxial layer $103_2$ may have a dopant concentration ranges from $1 \times 10^{14}$ cm$^{-3}$ to $1 \times 10^{17}$ cm$^{-3}$. However, one of ordinary skill in the art should understand that the dopant concentration ranges provided herein are just examples and are not intended to be limiting, any suitable dopant concentrations may be chosen according to practical design, fabrication and application requirements.

In accordance with an embodiment of the present invention, the semiconductor transistor 101 may further comprise a body region 104 formed in the substrate 103. The body region 104 may have a second conductivity type (e.g. illustrated as P type in FIG. 2) opposite to the first conductivity type and may be formed through second-conductivity-type dopant implantation in the substrate 103 (from the top surface of the epitaxial layer $103_2$). The body region 104 may have a relatively light dopant concentration compared to the source region 106.

In the exemplary embodiment shown in FIG. 2, the gate region 105 for the semiconductor transistor 101 is illustrated as a trenched gate region, comprising a trenched gate conduction layer $105_1$ and a gate dielectric layer $105_2$ formed in a gate trench $105_3$. The gate trench $105_3$ is formed in the substrate 103, extends vertically from the top surface S1 of the substrate 103 through the body region 104 into the epitaxial layer $103_2$. The gate dielectric layer $105_2$ lines the sidewalls and the bottom of the gate trench $105_3$, and the trenched gate conduction layer $105_1$ fills the lined gate trench $105_3$ and is thus isolated from the substrate 103 and the body region 104 by the gate dielectric layer $105_2$. In the example of FIG. 2, a plurality of trenched gate regions 105 are shown, the plurality of trenched gate regions 105 illustrated in sectional view are actually electrically connected with each other by transverse segments (illustrated in FIG. 2 by dotted line) of the trenched gate regions 105 having the same structure as those shown in the sectional view.

In accordance with an embodiment of the present invention, still referring to FIG. 2 and FIG. 3, the semiconductor device 100 may further comprise a source electrode 108 electrically coupled to the source region 106, a gate electrode 107 electrically coupled to the gate region 105 and a drain electrode (not shown in FIG. 2) electrically coupled to the drain region $103_1$. In the embodiment shown in FIG. 2, the source electrode 108 is exemplarily illustrated as to comprise a source metal 108 formed over the active cell area 103A. The gate electrode 107 is exemplarily illustrated as to comprise a gate metal 107 formed over the termination area 103T. The gate metal 107 may comprise a gate metal pad $107_1$ and a gate metal runner $107_2$. In the example illustrated in FIG. 2, the gate metal 107 is formed around outside of the source metal 108 and surrounds the source metal 108, with a gap therebetween to separate the gate metal 107 from the source metal 108. In other embodiments, the gate metal 107 may not necessarily totally surrounds the source metal 108. In FIG. 3, the source metal 108 is exemplarily illustrated to have a relatively large area compared to the gate metal 107 so as to enhance the capability of handling drain to source current of the source electrode 108 and to improve heat dissipation.

According to an embodiment of the present invention, the trenched gate regions 105 are electrically coupled to the gate metal 107 via at least one trenched gate contact 205. Each trenched gate contact 205 may comprise a contact conduction layer $205_1$ and a contact dielectric layer $205_2$ formed in a contact trench $205_3$. The trenched gate contact 205 has a trench width greater than that of the trenched gate regions 105 to facilitate the connection between the contact conduction layer $205_1$ and the gate metal 107 so as to couple the gate regions 105 to the gate metal 107. In one embodiment, the gate trenches $105_3$ and the contact trench $205_3$ are connected by a transverse segment (illustrated in FIG. 2 by dotted line) of either the gate trenches $105_3$ or the gate contact trench $205_3$ such that the trenched gate conduction layer $105_1$ is connected to the contact conduction layer $205_1$. Similarly as for the trenched gate regions 105, the contact dielectric layer $205_2$ lines the sidewalls and the bottom of the contact trench $205_3$, and the contact conduction layer $205_1$ fills the lined trench $205_3$ and is thus isolated from the substrate 103 and the body region 104 by the contact dielectric layer $205_2$. In one embodiment, the contact conduction layer $205_1$ and the trenched gate conduction layer $105_1$ may comprise a same conduction material such as doped polysilicon. In other embodiments, the contact conduction layer $205_1$ and the trenched gate conduction layer $105_1$ may comprise different conduction materials. In one embodiment, the contact dielectric layer $205_2$ and the gate dielectric layer $105_2$ may comprise a same dielectric material such as silicon dioxide. In other embodiments, the contact dielectric layer $205_2$ and the gate dielectric layer $105_2$ may comprise different dielectric materials. In FIG. 2, the contact trench $205_3$ and the gate trenches $105_3$ are illustrated to have a depth substantially the same, while in other embodiment the depth of the contact trench $205_3$ may not match that of the gate trenches $105_3$. One having ordinary skill in the art should understand that the structures and connections of the gate regions 105 and the trenched gate contact 205 shown in FIG. 2 are only for purpose of illustration. Actually, the structures, arrangements, and connection relationships of the gate regions 105 and the trenched gate contact 205 are not limited to that shown in FIG. 2 and that described above with reference to FIG. 2.

Figure 1A:
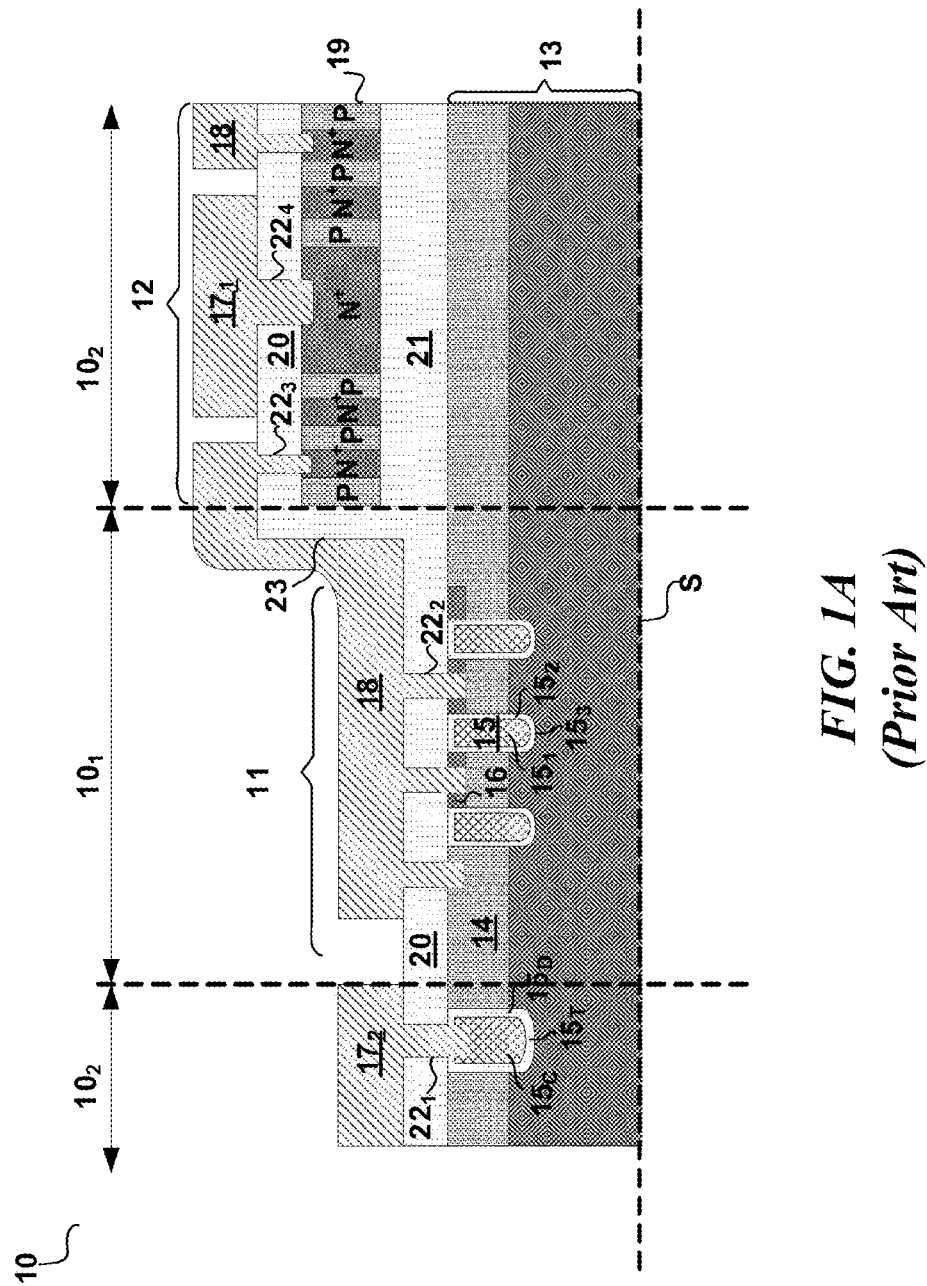
FIG. 1A illustrates a cross-sectional view of a typical semiconductor device 10 having a power transistor and an ESD protection module integrated together.

In accordance with an embodiment of the present invention, the ESD protection structure 102 is formed atop the top surface S1 of the substrate 103 over the termination area 103T of the substrate 103, and is disposed substantially between the gate metal 107 and the source metal 108, as illustrated in the cross-sectional view of FIG. 2. In an exemplary embodiment, further referring to the top plan view of FIG. 3, the ESD protection structure 102 is formed substantially surrounding the gate metal pad $107_1$, and may have a ring shape in top plan view. In accordance with an embodiment of the present invention, the ESD protection structure 102 may comprise an ESD protection layer 110 and a first isolation layer 109 disposed between the ESD protection layer 110 and the substrate 103 to isolate the ESD protection layer 110 from the substrate 103. In accordance with an embodiment of the present invention, referring to FIG. 2, the ESD protection structure 102 (ESD protection layer 110 and the first isolation layer 109 in entirety) includes a first portion $102_1$ adjacent to the source metal 108, a second portion $102_2$ adjacent to the gate metal 107 (e.g. the second portion $102_2$ is illustrated adjacent to the gate metal pad $107_1$ in FIG. 2) and a middle portion $102_3$ between and connecting the first portion $102_1$ and the second portion $102_2$, wherein the middle portion $102_3$ has a first thickness greater than a second thickness of the first portion $102_1$ and the second portion $102_2$, so that the ESD protection structure 102 has a substantially bilateral symmetrical benched shape in cross-sectional view. Therefore, the ESD protection structure 102 has a downward step (a first step) 31 transitioning from the left side edge (the edge adjacent to the source metal 108) of the middle portion $102_3$ to the first portion $102_1$ and a downward step (a second step) 32 transitioning from the right side edge (the edge adjacent to the gate metal pad $107_1$) of the middle portion $102_3$ to the second portion $102_2$. In accordance with an embodiment of the present invention, the first step 31 and the second step 32 may have a step height substantially the same. In the exemplary embodiment shown in FIG. 2, since the second thickness of the first portion $102_1$ and the second portion $102_2$ is smaller than the first thickness of the middle portion $102_3$ (i.e., the ESD protection structure 102 has a reduction/degradation in thickness from the middle portion $102_3$ toward both the first portion $102_1$ near the source metal 108 side and the second portion $102_2$ near the gate metal 107 side), the ESD protection structure 102 may have a top surface S2 of a substantially bilateral symmetrical benched shape in cross-sectional view, wherein a first vertical distance from the top surface S2 at the middle portion $102_3$ to the top surface S1 of the substrate 103 is greater than a second vertical distance from the top surface S2 at the first portion $102_1$ and the second portion $102_2$ to the top surface S1 of the substrate 103. Thus, the semiconductor device 100 may have a transition step 33 of a reduced step height, compared to that of the transition step 23 in the semiconductor device 10 of FIG. 1A, from the top surface S1 of the semiconductor transistor 101 to the top surface S2 of the ESD protection structure 102. Therefore, a difference in height between the top surface S1 of the semiconductor transistor 101 (e.g. the MOSFET 101 in FIG. 2) and the top surface S2 of the ESD protection structure 102 is reduced with reference to the bottom surface S3 of the substrate 103. Accordingly, the ESD protection structure 102 in accordance with various embodiments of the present invention having the structure described with reference to FIGS. 2 and 3 may be beneficial to formation of interlayer vias (e.g. the vias $112_1$, $112_2$, $112_3$ and $112_4$ illustrated in FIG. 2 and described in more detail in the following) from the metal layer (e.g. including the gate metal 107 and the source metal 108) to the substrate 103 (or the semiconductor device 101) and to the ESD protection layer 110 of the ESD protection structure 102 in a same manufacturing step.

In the present disclosure, the terms "lateral" and "laterally" refer to a direction parallel to the cut line AA'. The term "width" and the like refer to a size measured laterally. The terms "vertical" and "vertically" refers to a direction perpendicular to the top surface S1 and the bottom surface S3 of the substrate 103. The terms "depth", "height", "thickness" and the like refer to a size measured vertically.

Figure 1B:
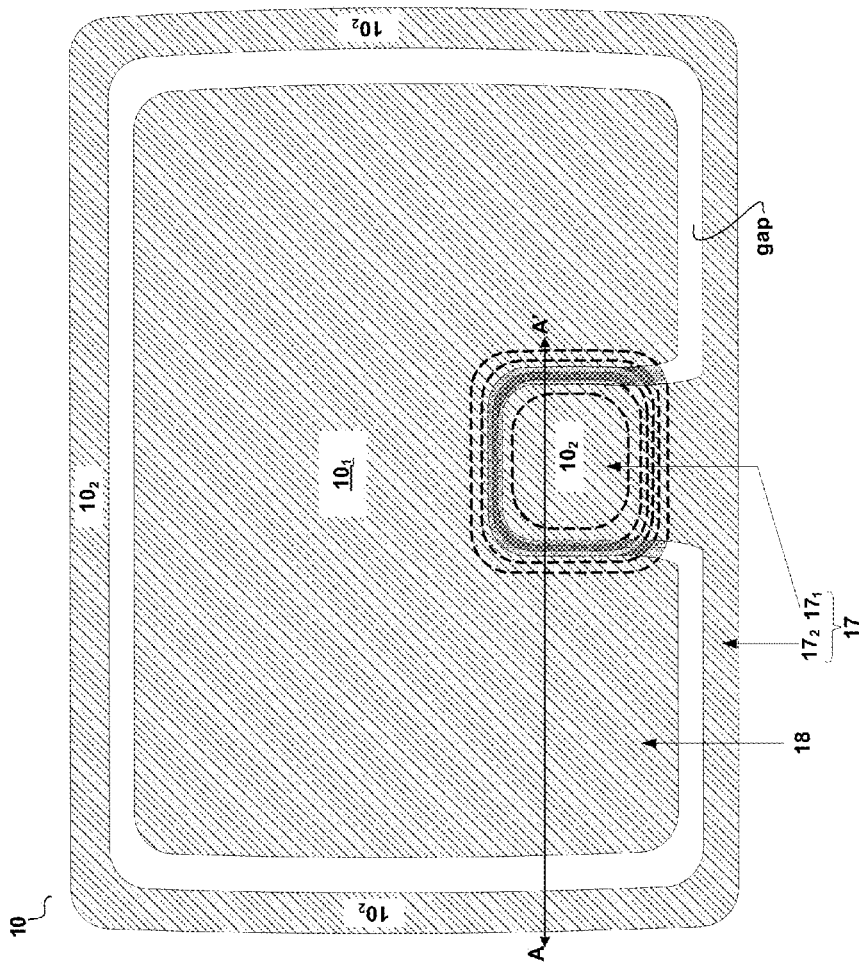
FIG. 1B illustrates a top plan view of the semiconductor device 10.

In accordance with an embodiment of the present invention, the semiconductor device 100 may further comprise an interlayer dielectric ("ILD") layer 111 that is disposed between the metal layer (e.g. including the source metal 108 and gate metal 107) and the ESD protection structure 102 and the substrate 103 to prevent the source metal 108 being undesirably shorted to the gate region 105 and/or the gate metal 107 being undesirably shorted to the source region 106. In accordance with an embodiment of the present invention, the gate region 105 is electrically coupled to the gate metal 107 (e.g. to the gate metal pad $107_1$ and the gate metal runner $107_2$) through a first plurality of vias $112_1$ formed in the ILD layer 111. In the example of FIG. 2, the first plurality of vias $112_1$ is disposed over the trenched gate contact 205 and connecting the contact conduction layer $205_1$ to the gate metal 107. The source region 106 is electrically coupled to the overlying source metal 108 through a second plurality of vias $112_2$ formed in the ILD layer 111. The ESD protection structure 102 is electrically coupled to the overlying source metal 108 through a third plurality of vias $112_3$ formed in the ILD layer 111 and disposed over the first portion $102_1$ of the ESD protection structure 102. The ESD protection structure 102 is further electrically coupled to the overlying gate metal pad $107_1$ through a fourth plurality of vias $112_4$ formed in the ILD layer 111 and disposed over the second portion $102_2$ of the ESD protection structure 102. In the embodiment shown in FIG. 2, since the transition step 33 has a reduced step height compared to that of the transition step 23 in the semiconductor device 10, the first plurality of vias $112_1$, the second plurality of vias $112_2$, the third plurality of vias $112_3$ and the fourth plurality of vias $112_4$ may be formed at the same time and sharing same manufacturing steps. For instance, the first plurality of vias $112_1$, the second plurality of vias $112_2$, the third plurality of vias $112_3$ and the fourth plurality of vias $112_4$ can be formed by etching the ILD layer 111 with the shield of a patterned photoresist layer atop the ILD layer 111 at the same time. Affection of the transition step 33 to patterning of the photoresist layer under a given focal depth may be negligible or at least alleviated. If the patterns defining the first and the second plurality of vias $112_1$ and $112_2$ are focused, the patterns defining the third and the fourth plurality of vias $112_3$ and $112_4$ can also be focused within an acceptable focal tolerance margin. Thus, the third and the fourth plurality of vias $112_3$ and $112_4$ may be formed as required with higher precision in comparison with the third and the fourth interlayer vias $22_3$ and $22_4$ in FIG. 1. In consequence, the reduction/degradation in thickness from the middle portion $102_3$ toward both the first portion $102_1$ and the second portion $102_2$ of the ESD protection structure 102 advantageously reduces the possibility of failing in opening the third and the fourth plurality of vias $112_3$ and $112_4$ and improves the precision in dimension control of these vias, even if the required critically dimension of these vias is small. One having ordinary skill in the art should understand that the term "plurality of" herein is not exclusively limited to more than one, but is intended to include one.

In accordance with an embodiment of the present invention, the first isolation layer 109 of the ESD protection structure 102 has the ring shape in consistency with the ESD protection structure 102 in top plan view. Still referring to FIG. 2, in cross-sectional view, the first isolation layer 109 may comprise a first thin isolation portion $109_1$, a second thin isolation portion $109_2$ and a thick middle isolation portion $109_3$ between and connecting the first thin isolation portion $109_1$ and the second thin isolation portion $109_2$. The first thin isolation portion $109_1$, the second thin isolation portion $109_2$ and the thick middle isolation portion $109_3$ are respectively located in the first portion $102_1$, the second portion $102_2$ and the middle portion $102_3$ of the ESD protection structure 102. The thick middle isolation portion $109_3$ has a greater thickness than that of the first and the second thin isolation portions $109_1$ and $109_2$, leading to reduction/degradation in thickness of the ESD protection structure 102 from the middle portion $102_3$ toward both the first portion $102_1$ and the second portion $102_2$ so that the height of the transition step 33 is reduced.

In accordance with an embodiment of the present invention, the ESD protection layer 110 may comprise a doped polysilicon layer having a thickness substantially uniform at the first portion $102_1$, the second portion $102_2$ and the third portion $102_3$ of the ESD protection structure 102. In an embodiment, the ESD protection layer (e.g. doped polysilicon layer) 110 may include a plurality of alternately disposed first-conductivity-type doped zones $110_1$ (e.g. illustrated in FIG. 2 and FIG. 4 as $N^+$ type doped zones) and second-conductivity-type doped zones $110_2$ (e.g. illustrated in FIG. 2 and FIG. 4 as P type doped zones), i.e. the plurality of first-conductivity-type doped zones $110_1$ and the plurality of second-conductivity-type doped zones $110_2$ are interleaved with each other. For instance, in the examples shown in FIG. 2, FIG. 3 and FIG. 4, the plurality of alternately disposed first-conductivity-type doped zones $110_1$ and second-conductivity-type doped zones $110_2$ are illustrated as a plurality of alternately disposed $N^+$ type and P type doped zones having an arrangement $N^+$-P-$N^+$-P-$N^+$ from an inner side to an outer side of the ESD protection layer 110, wherein the inner side in these particular examples may refer to the side adjacent to the gate metal pad $107_1$ and the outer side may refer to the side adjacent to the source metal 108. In other alternative embodiments of the present invention, the ESD protection layer 110 may be formed of other conductive or semi-conductive materials other than polysilicon that are compatible with other aspects of the device manufacturing process. Thus, the term "poly-silicon" is intended to include such other conductive or semi-conductive materials and combinations thereof in addition to silicon.

Figure 4:
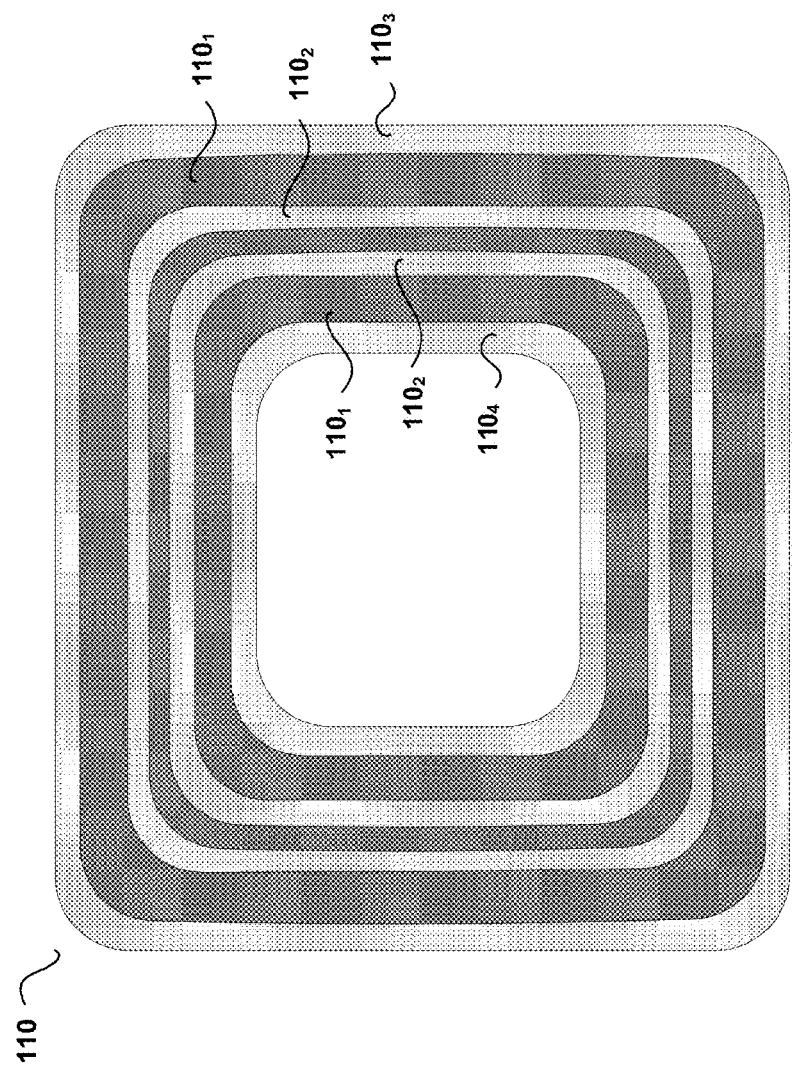
FIG. 4 illustrates a top plan view illustrating a plan arrangement of the ESD protection layer 110 in accordance with an exemplary embodiment of the present invention.

In accordance with an embodiment of the present invention, the ESD protection layer 110 has the ring shape in consistency with the ESD protection structure 102 in top plan view, referring to FIG. 3. For better understanding, FIG. 4 shows an enlarged top plan view illustrating a plan arrangement of the ESD protection layer 110 in accordance with an exemplary embodiment of the present invention. In FIG. 4, the ring shape of the ESD protection layer 110 (or of the ESD protection structure 102) is illustrated in round rectangle ring shape. However, those having ordinary skill in the art should understand that the ESD protection structure (the ESD protection layer 110 and the first isolation layer 109) is not limited to have round rectangle ring shape, but can have any other types of ring shape, such as round circular ring shape, elliptic ring shape, round polygonal ring shape etc. Therefore, the term "ring shape" in the present disclosure is only descriptive but not exclusive, and is intended to include any closed ring shape. Now further referring to the cross-sectional view of FIG. 2, the ring shaped ESD protection layer 110 may include a middle doped zone $110_1$ of the first conductivity type (e.g. illustrated in FIG. 2 as an N$^+$ type middle doped zone), and a plurality of second-conductivity-type doped zones $110_2$ (e.g. illustrated in FIG. 2 as P type doped zones) and first-conductivity-type doped zones $110_1$ (e.g. illustrated in FIG. 2 as N$^+$ type doped zones) arranged alternately from both sides of the middle doped zone $110_1$ towards both the inner side and the outer side of the ESD protection layer 110, wherein the middle doped zone $110_1$ is disposed at the middle of the middle portion $102_3$ of the ESD protection structure 102. Each of the plurality of the first-conductivity-type doped zones $109_1$ and the second-conductivity type doped zones $109_2$ is also of ring shape. To provide better understanding, in the illustrative examples of FIG. 2 and FIG. 4, the ring shaped ESD protection layer 110 is illustrated to include an N$^+$ type middle doped zone $110_1$ and a plurality of alternately disposed P type ($109_2$) and N$^+$ type ($109_1$) doped zones having an arrangement P-N$^+$ at both sides of the N$^+$ type middle doped zone $110_1$.

According to the exemplary embodiments described with reference to FIGS. 2-4, the ESD protection structure 102 actually comprises a plurality of PN diodes (PN junctions) that are formed by the plurality of alternately disposed first-conductivity-type doped zones $109_1$ (including the middle doped zone $109_1$) and second-conductivity-type doped zones $109_2$ in the ESD protection layer 110. In accordance with an embodiment of the present invention, the PN junctions formed among the plurality of alternately disposed first-conductivity-type doped zones $109_1$ and second-conductivity-type doped zones $109_2$ are disposed in the middle portion $102_3$ of the ESD protection structure 102. Portions of the ESD protection layer 110 located at the first portion $102_1$ and the second portion $102_2$ of the ESD protection structure 102 are of a uniform doped type, either the first-conductivity-type or the second-conductivity-type so that no PN junction is formed in these portions. For example, in FIG. 2, portions of the ESD protection layer 110 located at the first portion $102_1$ and the second portion $102_2$ are of N$^+$ type and do not contain any PN junction. However, this is not intended to be limiting, in other embodiments, the portions of the ESD protection layer 110 located at the first portion $102_1$ and the second portion $102_2$ can be doped with both the first-conductivity-type and the second-conductivity-type. Nevertheless, it is usually desired in certain practical applications that no PN junction is formed in the portions of the ESD protection layer 110 located at the first portion $102_1$ and the second portion $102_2$ of the ESD protection structure 102. This is because, when the ESD protection structure 102 is connected to electrical potentials (i.e. the PN diodes within the ESD protection structure 102 are connected to electrical potentials), electrical field intensity at the middle portion $102_3$ holding the PN junctions is relatively high compared to that at the first portion $102_1$ and the second portion $102_2$ holding no PN junction. Since the middle isolation portion $109_3$ of the first isolation layer 109 has greater thickness than the first isolation portion $109_1$ and the second isolation portion $109_2$, the relatively high electrical field strength at the middle portion $102_3$ can be sustained by the middle isolation portion $109_3$.

In accordance with an embodiment of the present invention, the innermost first-conductivity-type doped zone $110_1$ (which is located closest to the gate metal pad $107_1$) among the plurality of alternately arranged first-conductivity-type doped zones $110_1$ and second-conductivity-type doped zones $110_2$ is electrically coupled to the gate metal pad $107_1$ through the fourth plurality of vias $112_4$, the outermost first-conductivity-type doped zone $110_1$ (which is located furthest to the gate metal pad $107_1$) among the plurality of alternately arranged first-conductivity-type doped zones $110_1$ and second-conductivity-type doped zones $110_2$ is electrically coupled to the source metal 108 through the third plurality of vias $112_3$. Therefore, the ESD protection structure 102 (i.e. the plurality of PN diodes in the ESD protection layer 110) is electrically coupled between the gate metal 107 (or the gate region 105) and the source metal 108 (or the source region 106) of the semiconductor transistor 101 (e.g. MOSFET in FIG. 2). In accordance with an embodiment of the present invention, when a gate-to-source voltage Vgs caused by electro-static discharge presents between the gate region 105 and the source region 106 of the semiconductor transistor 101 and exceeds an ESD threshold voltage Vth of the ESD protection structure 102, the series connected PN diodes are turned on (i.e. the ESD protection structure 102 is turned on) to provide a current conduction path between the gate region 105 and the source region 106 of the semiconductor transistor 101 so as to protect the gate dielectric layer $105_2$ of the gate region 105 from being damaged. The ESD threshold voltage Vth can be modified by modifying the number of the plurality of alternately disposed first-conductivity-type doped zones $110_1$ and second-conductivity-type doped zones $110_2$. Consequently, the term "plurality of" herein is not exclusively limited to more than one, but is intended to include one.

In accordance with an embodiment of the present invention, the ESD protection layer 110 may further have a first floating doped zone $110_3$ and a second floating doped zone $110_4$. The first floating doped zone $110_3$ (e.g. illustrated as a first P$^-$ type doped zone in FIGS. 2 and 4) is formed at the outer side edge of the ESD protection structure 102, e.g. disposed surrounding and next to the outermost first-conductivity-type doped zone $110_1$. The second floating doped zone $110_4$ (e.g. illustrated as a second P$^-$ type doped zone in FIGS. 2 and 4) is formed at the inner side edge of the ESD protection structure 102, e.g. disposed next to and surrounded by the innermost first-conductivity-type doped zone $110_1$. In the embodiments of FIGS. 2-3, the first floating doped zone $110_3$ and the second floating doped zone $110_4$ may have the second-conductivity-type and may have a relatively light dopant concentration, for instance, as light as or lighter than that of the plurality of second-conductivity-type doped zones $110_2$. As an example, the first and the second floating doped zones $110_3$ and $110_4$ in the embodiment of FIG. 2 are illustrated as P$^-$ type doped zones having lighter dopant concentration than the P type doped zones $110_2$. However, this is not intended to be limiting. The first and the second floating doped zones $110_3$ and $110_4$ are not intended to couple any established potentials (e.g. the first and the second floating doped zones $110_3$ and $110_4$ are not coupled to any of the source electrode/source metal 108, gate electrode/gate metal 107 and drain electrode of the semiconductor transistor 101), but are electrically floating and have floating potentials. The first and the second floating doped zones $110_3$ and $110_4$ form a potential barrier to the free carriers (e.g. to free electrons in the examples of FIGS. 2-4) outside the ESD protection layer 110 to block leakage current from going through. Thus, the ESD protection structure 102 is shielded from being affected by outside free carriers. This works similarly as a junction-isolation to protect the core ESD protection structure formed by the plurality of alternately disposed first-conductivity-type doped zones $110_1$ and second-conductivity-type doped zones $110_2$ inside first and the second floating doped zones $110_3$ and $110_4$. Therefore, the safety and ESD current handling performance of the ESD protection structure 102 can be further improved.

In accordance with various embodiments of the present invention described with reference to FIGS. 2-4, the ESD protection structure 102 is located substantially between the gate metal pad $107_1$ and the source metal 108, and is of ring shape substantially surrounding the gate metal pad $107_1$. The ESD protection structure 102 may partially overlap with the source metal 108 at the first portion $102_1$, and with the gate metal pad $107_1$ at the second portion $102_2$ so that the source metal 108 and the gate metal pad $107_1$ can be coupled to the ESD protection structure 102 through the third and the fourth plurality of vias $112_3$ and $112_4$. Since the ESD protection structure 102 is of ring shape substantially surrounding the gate metal pad $107_1$, unlike the semiconductor device 10, interlayer vias (such as the interlayer via $112_1$ illustrated at the right side of FIG. 2) can also be formed in the ILD layer 111 under the gate metal pad $107_1$ to electrically couple the gate regions 105 to the gate metal pad $107_1$. For instance, in FIG. 2, a trenched gate contact 205 (which is intended to include "a plurality of trenched gate contacts 205") may also be formed in the termination area 103T of the substrate 103 under the gate metal pad $107_1$. The first plurality of vias $112_1$ are formed not only in the ILD layer 111 under the gate metal runner $107_2$ but also in the ILD layer 111 under the gate metal pad $107_1$ so that the gate metal pad $107_1$ is also connected to the contact conduction layer $205_1$ of the underlying trenched gate contact 205, and thus is electrically coupled to the gate regions 105. In this circumstance, the electrical conductivity between the gate regions 105 and the gate metal 107 is improved and the current handling capacity of the gate electrode 107 is enhanced.

Figure 5:
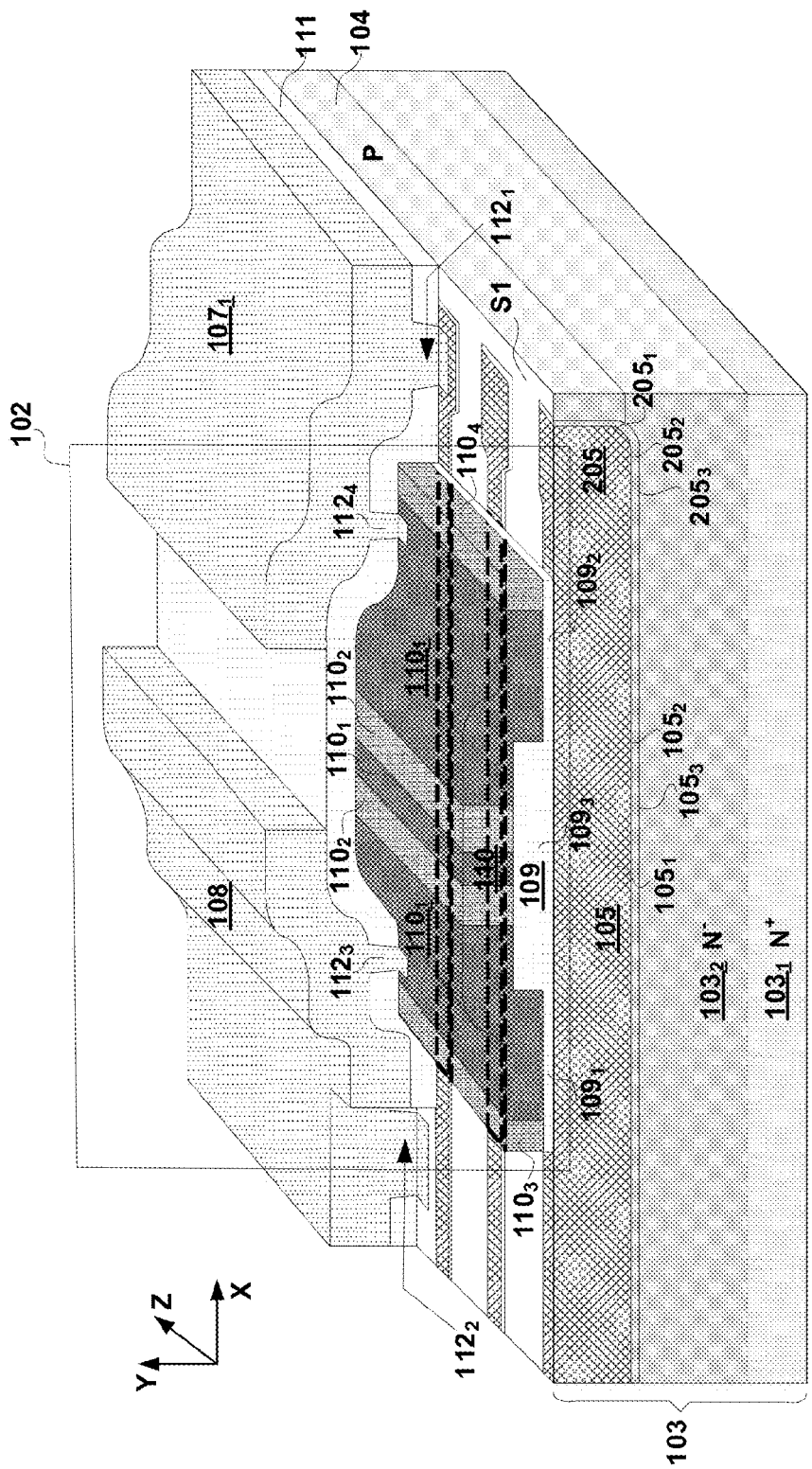
FIG. 5 illustrates a three-dimensional perspective view of a portion of the semiconductor device 100 of FIG. 3 in accordance with an embodiment of the present invention.

FIG. 5 illustrates a three-dimensional perspective view of a portion of the semiconductor device 100 of FIG. 3 in accordance with an embodiment of the present invention. It can be understood that the perspective view of FIG. 5 may correspond to the portion indicated with the dashed line rectangular 51 in the top plan view of FIG. 3 and observed substantially from the direction indicated by the arrow 52. However, it should be understood that the corresponding relationship between the perspective view and the top plan view of the semiconductor device 100 illustrated in FIG. 5 and FIG. 3 are not intended to be limiting. As shown in FIG. 5, the trenched gate regions 105 may be formed tunneling/extending through a portion of the substrate 103 beneath the ESD protection structure 102 to reach and connect with the trenched gate contact 205 underlying the gate metal pad $107_1$. Therefore, the trenched gate regions 105 are electrically coupled to the gate metal pad $107_1$ by the trenched gate contact 205 and the vias $112_1$ under the gate metal pad $107_1$. In the example of FIG. 5, each of the trenched gate contacts 205 may be formed by increasing the width of the trenched gate region 105 that it is connected to. The "width" herein is measured in the z axis direction of the rectangular coordinates system XYZ in space. In this exemplary embodiment, since the gate regions 105 are not only formed in the active cell area 103A of the substrate 103 but can also be formed in the portion of the substrate 103 beneath the ESD protection structure 102 in the termination area 103T, the substrate 103 is more effectively used and the conductivity between the gate regions 105 and the gate electrode 107 is further improved.

Although the present disclosure takes the example of an N-channel vertical semiconductor device 100 comprising the N-channel vertical MOSFET 101 and the ESD protection structure 102 to illustrate and explain the structures of a semiconductor device having an ESD protection structure according to various embodiments of the present invention described above with reference to FIGS. 2-5, this is not intended to be limiting. Persons of ordinary skill in the art will understand that the structures and principles taught herein also apply to other types of semiconductor materials and devices as well, for example, the device 100 may be a P-channel semiconductor device. In other alternative embodiments, the semiconductor transistor 101 may be a DMOS transistor, BJT etc. The semiconductor transistor 101 is not limited to vertical transistor and trenched gate transistor described, but can be a lateral transistor or a planar gate transistor instead.

The advantages of the various embodiments of the ESD protection structure 102 and the semiconductor device 100 comprising the same of the present invention are not confined to those described above. These and other advantages of the various embodiments of the present invention will become more apparent upon reading the whole detailed descriptions and studying the various figures of the drawings.

FIGS. 6A through 6H are cross-sectional views illustrating schematically a sequential process of a method for forming a semiconductor device (e.g. the semiconductor device 100) having an ESD protection structure (e.g. the ESD protection structure 102) in accordance with an embodiment of the present invention.

Figure 6A:
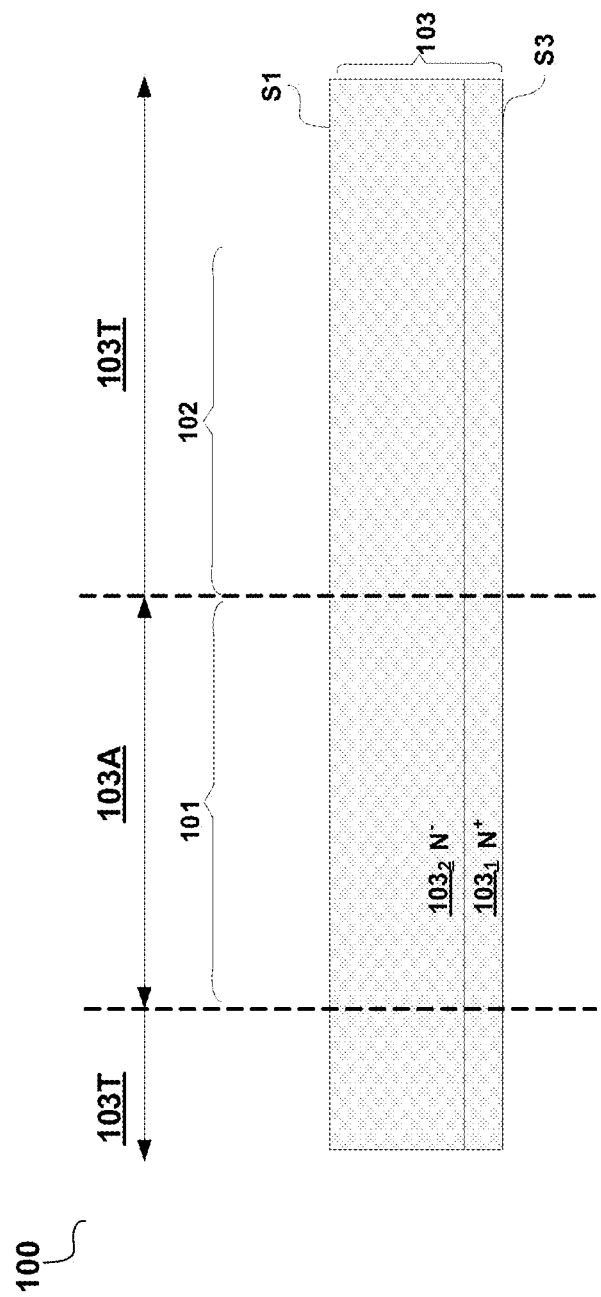
FIGS. 6A-6H are cross-sectional views illustrating schematically a sequential process of a method for forming a semiconductor device having an ESD protection structure in accordance with an alternative embodiment of the present invention.

Referring to FIG. 6A, a semiconductor substrate 103 having a first conductivity type (e.g. illustrated as N type in FIG. 6A) is provided. The substrate 103 may comprise a relatively heavy doped substrate layer $103_1$ (e.g. illustrated as an $N^+$ substrate layer in FIG. 6A) and a relatively light doped epitaxial layer $103_2$ (e.g. illustrated as an $N^-$ epitaxial layer in FIG. 6A) formed on the substrate layer $103_1$. The substrate 103 may be divided into an active cell area 103A and a termination area 103T (further referring to the top plan view illustration in FIG. 3) that are respectively designated for forming active cells of a semiconductor transistor 101 and the ESD protection structure 102. It should be understood that the cross sectional views in FIGS. 6A-6H illustrate only portions of the semiconductor device 100. For instance, it can be understood that the cross-sectional views of FIGS. 6A-6H correspond to the portion cut from the cut line AA' in FIG. 3 for better understanding.

Figure 6B:
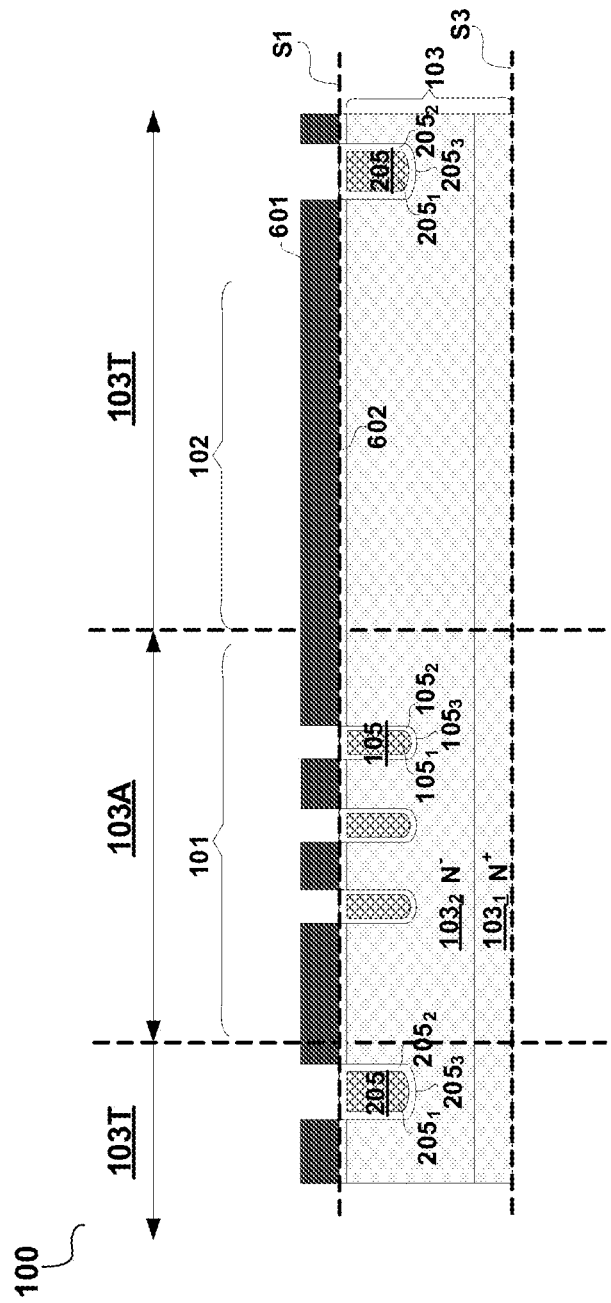

Subsequently, referring to FIG. 6B, a gate region 105 (which is intended to include "a plurality of gate regions") of the semiconductor transistor 101 is formed in the active cell area 103A. In accordance with an exemplary embodiment of the present invention, the gate region 105 may comprise trenched gate region having a trenched gate $105_1$ lined with a gate dielectric layer $105_2$. Forming the gate region 105 may comprise: forming a first mask layer 601 atop the substrate 103 and patterning the first mask layer 601 according to designed patterns of the gate regions 105; forming a gate trench (which is intended to include "a plurality of gate trenches") $105_3$ having sidewalls and a bottom in the substrate 103 with the shield of the patterned first mask layer 601; forming the gate dielectric layer $105_2$ lining the sidewalls and bottom of the gate trench $105_3$; and filling the lined gate trench $105_3$ with the gate conduction layer $105_1$. In one embodiment, the gate dielectric layer $105_2$ may comprise silicon dioxide, the gate conduction layer $105_1$ may comprise doped polysilicon. In accordance with an exemplary embodiment of the present invention, except forming the gate region/gate regions 105, a trenched gate contact 205 (which is intended to include "a plurality of trenched gate contacts") is also formed in the termination area 103T of the semiconductor substrate 103. The trenched gate contact 205 may comprise a trenched contact conduction layer $205_1$ lined with a contact dielectric layer $205_2$. In one embodiment, the trenched gate contact/gate contacts 205 are formed at the same time/with the same processes as forming the trenched gate region/gate regions 105. For instance, forming the trenched gate contact/gate contacts 205 may comprise: forming a contact trench 205$_3$ (which is intended to include "a plurality of contact trenches") having sidewalls and a bottom with the shield of the patterned first isolation layer 601, wherein the patterning of the first isolation layer 601 is modified by adding the designed patterns of the trenched gate contact/gate contacts 205; forming the contact dielectric layer 205$_2$ lining the sidewalls and bottom of the contact trench 205$_3$; and filling the lined contact trench 205$_3$ with the contact conduction layer 205$_1$. In the example of FIG. 6B, the trenched gate contact/gate contacts 205 are connected to the trenched gate/trenched gates 105 and have the same structure as the trenched gate/trenched gates 105 except that the trenched gate contact/gate contacts 205 have greater trench width than the trenched gate/trenched gates 105.

Figure 6C:
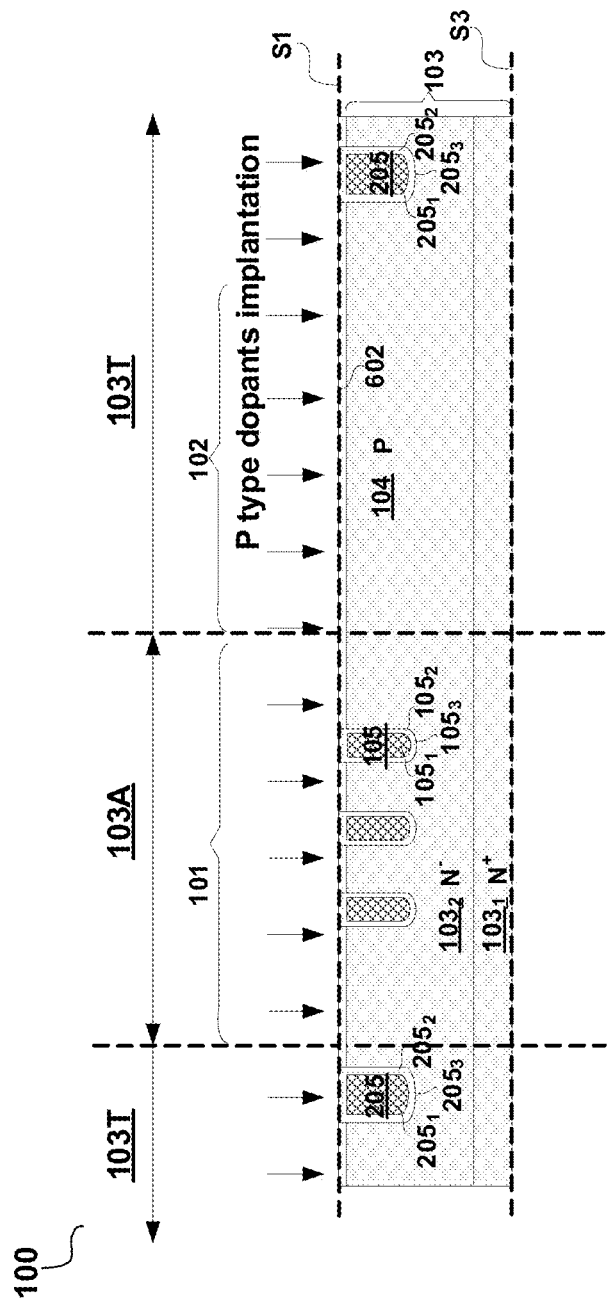

Subsequently, referring to FIG. 6C, a body region 104 having a second conductivity type (e.g. illustrated as P type in FIG. 6C) opposite to the first conductivity type is formed in the semiconductor substrate 103 through second conductivity type dopant implantation (e.g. P type dopants implantation in FIG. 6C) from the top surface S1 of the substrate 103. Those having ordinary skill in the art can understand that the body implantation has quite small negligible influence to the gate regions 105. Except dopant implantation, diffusing and other processes may also be performed to form the body region 104, and during body dopant implantation, diffusing and other processes, the top surface of the trenched gate conduction layer 105$_1$ and the trenched contact conduction layer 205$_1$ may be oxidized and a thin oxidation layer (as illustrated in FIG. 6C) may be formed at the top surface of each of the trenched gates 105 and the trenched gate contacts 205. Practically, the top surface 51 of the semiconductor substrate 103 may also be oxidized during dopant implantation, diffusing and other processes resulting in a thin oxidation layer 602 formed on the top surface 51 of the substrate 103. According to an alternative embodiment, forming the body region 104 illustrated in FIG. 6C may be performed before forming the gate regions 105 and the gate contacts 205 illustrated in FIG. 6B. According to another alternative embodiment, the diffusing of the body implants may not be performed immediately following the body dopant implantation, but can be performed later e.g. after source dopant implantation so as to save process steps and costs.

Figure 6D:
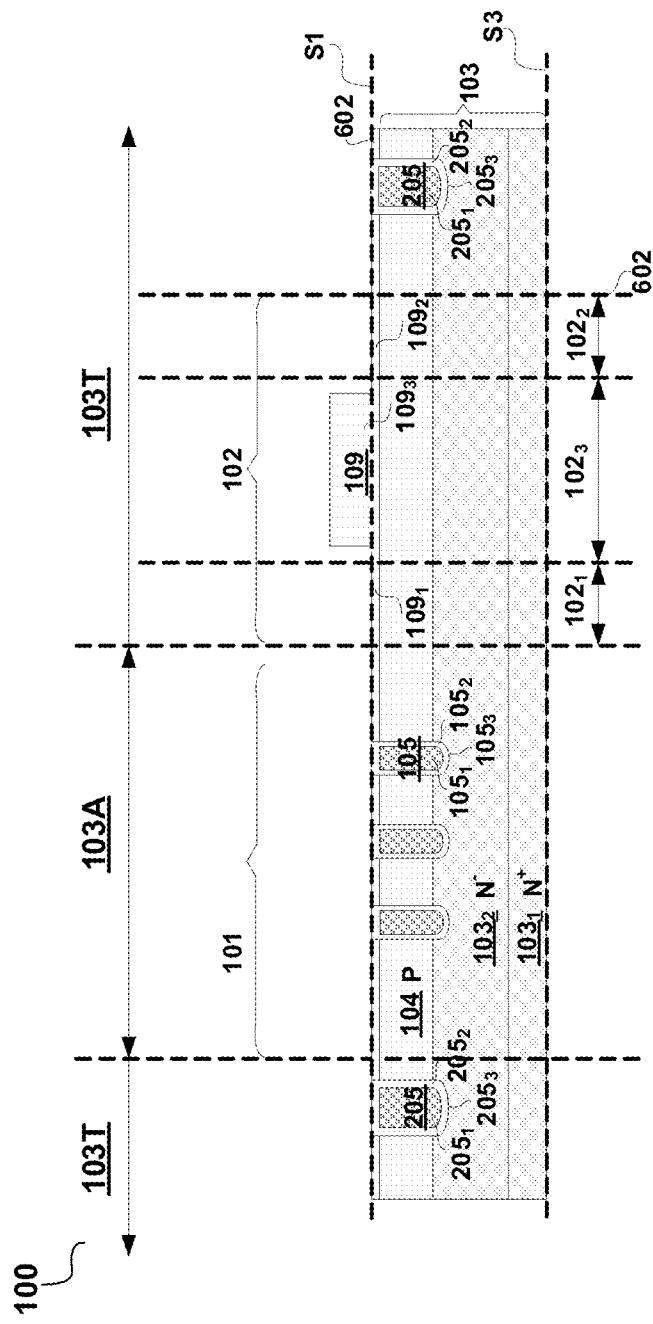

Subsequently, referring to FIG. 6D, a first isolation layer 109 is formed atop the top surface 51 of the semiconductor substrate 103 and a second patterned mask layer (not shown in FIG. 6D) is applied on the first isolation layer 109 to shield a portion of the first isolation layer 109, wherein the shielded portion of the first isolation layer 109 is intended to be the middle isolation portion 109$_3$. In the following, unshielded portions of the first isolation layer 109 are removed and the shielded portion forms the middle isolation portion 109$_3$, then the patterned second mask layer is removed. The middle isolation portion 109$_3$ has a greater thickness than the thin oxidation layer 602 and has a ring shape. The middle isolation portion 109$_3$ and the thin oxidation layer 602 together form a patterned first isolation layer 109 of the ESD protection structure 102. For instance, the thin oxidation layer 602 located at the left side (a first side/an outer side of the ring shaped middle isolation portion 109$_3$) of the middle isolation portion 109$_3$ forms the first isolation portion 109$_1$ of the patterned first isolation layer 109, and the thin oxidation layer 602 located at the right side (a second side/an inner side of the ring shaped middle isolation portion 109$_3$) of the middle isolation portion 109$_3$ forms the second isolation portion 109$_2$ of the patterned first isolation layer 109.

Figure 6E:
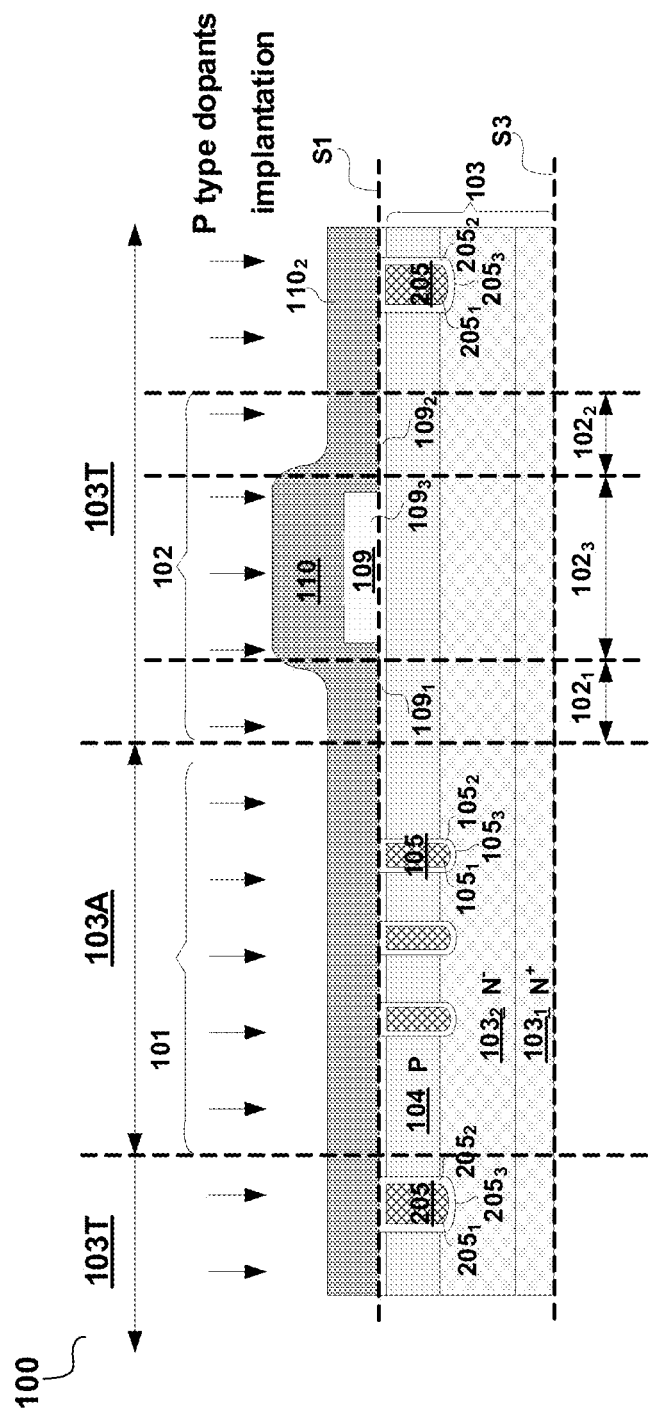

Subsequently, referring to FIG. 6E, an ESD polysilicon layer 110 is formed atop the substrate 103 and the patterned first isolation layer 109. In the following, dopants of the second-conductivity-type (e.g. P type in FIG. 6E) are implanted into the ESD polysilicon layer 110 to form a second-conductivity-type doped zone 110$_2$.

Figure 6F:
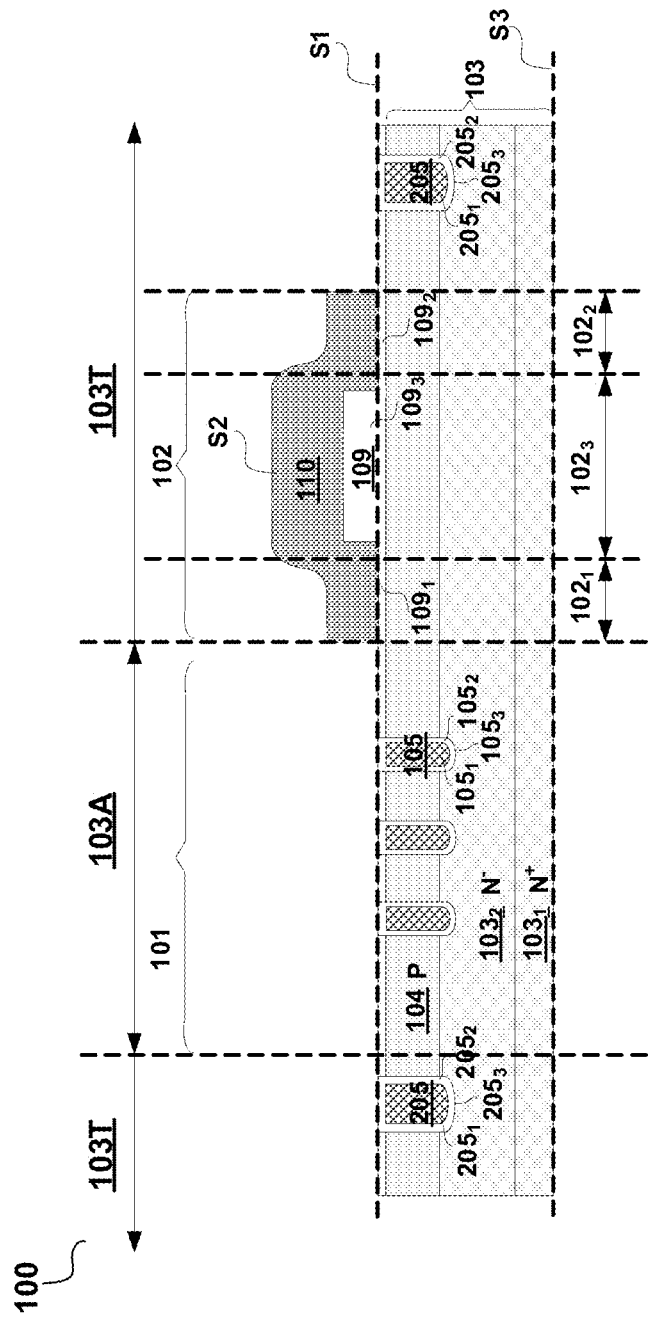

Now referring to FIG. 6F, a patterned ESD mask layer (not shown in FIG. 6F) is applied to shield a portion of the ESD polysilicon layer 110 that is designated for forming the ESD protection structure 102, and in subsequence, exposed portions of the ESD polysilicon layer 110 are removed. In the following the patterned ESD mask layer is removed, thereby leaving a remained portion of the ESD polysilicon layer 110 that was shielded by the patterned ESD mask layer, wherein the remained portion of the ESD polysilicon layer 110 is of ring shape in top plan view and shields the patterned first isolation layer 109 (i.e. the first isolation portion 109$_1$, the second isolation portion 109$_2$ and the middle isolation portion 109$_3$).

Figure 6G:
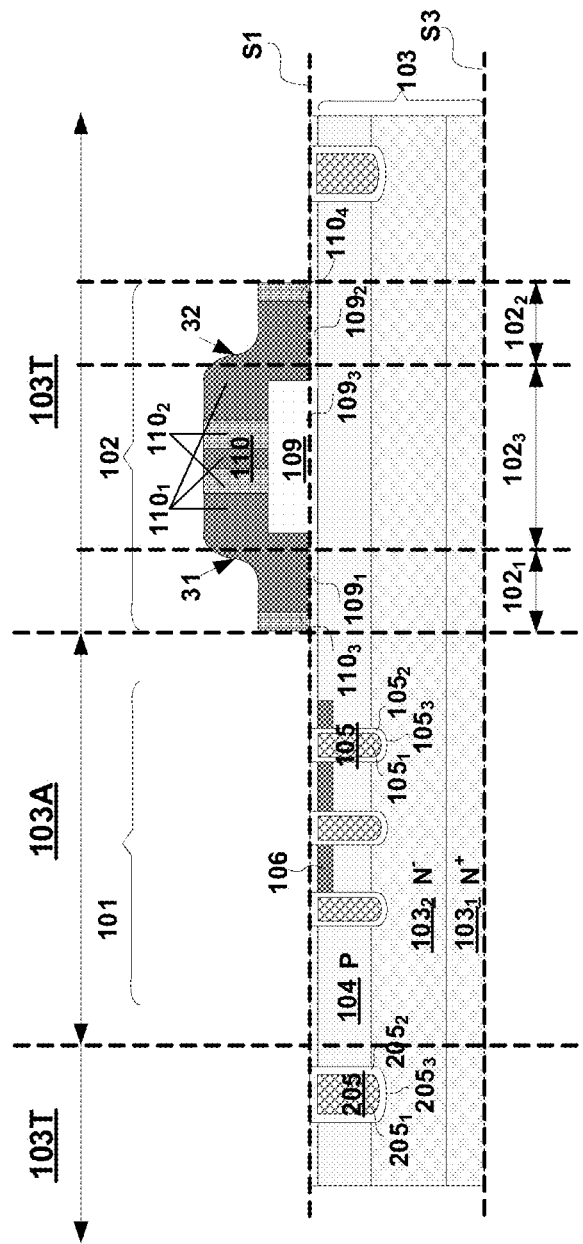

Now referring to FIG. 6G, a patterned source implantation mask layer (not shown in FIG. 6G for simplicity) is applied on the remained portion of the ESD polysilicon layer 110 and the substrate 103 to expose surface areas from which dopants of the first conductivity type (e.g. N$^+$ type in FIG. 6G) need to be implanted so as to form a plurality of first-conductivity-type doped zones 110$_1$ in the ESD polysilicon layer 110 and form source regions 106 in the active cell area 103A of the substrate 103. One of ordinary skill in the art should understand that after the dopants implantation, a diffusing process and a step for removing the patterned source implantation mask layer may be proceeded in the following. The source implantation mask layer may have a designed pattern so that after the implantation process of FIG. 6G, the ESD polysilicon layer 110 contains a plurality of first-conductivity type doped zones 110$_1$ (e.g. illustrated in FIG. 6G as N$^+$ type doped zones) interleaving with a plurality of second-conductivity type doped zones 110$_2$ (e.g. illustrated in FIG. 6G as P type doped zones), wherein the first-conductivity type doped zones 110$_1$ and second-conductivity type doped zones 110$_2$ are arranged alternately from an inner side toward an outer side of the ESD polysilicon layer 110, and in the meanwhile, the source regions 106 are laterally located on both sides of the gate regions 105 in the body region 104. For instance, in one embodiment, the patterned source implantation mask layer may include a plurality of mask rings, wherein the plurality of mask rings are arranged from the inner side toward the outer side of the ESD polysilicon layer 110. After the step of FIG. 6G, formation of the ESD protection structure 102 is completed. The ESD protection structure 102 is of ring shape in top plan view and comprises a first portion 102$_1$, a second portion 102$_2$ and a middle portion 102$_3$, wherein the middle portion 102$_3$ has greater thickness than the first portion 102$_1$ and the second portion 102$_2$ and the middle isolation portion 109$_3$ is located in the middle portion 102$_3$. In the exemplary embodiment of FIG. 6G, after the first-conductivity-type dopants implantation, the ESD polysilicon layer 110 contains a first-conductivity type middle doped zone 110$_1$ (e.g. illustrated in FIG. 6G as a middle doped zone of N$^+$ type) located at the middle of the middle portion 102$_3$, and a plurality of second-conductivity type doped zones 110$_2$ and first first-conductivity-type doped zones 110$_1$ arranged alternately from both sides of the middle doped zone 110$_1$ towards both the inner side and the outer side of the ESD polysilicon layer 110. In an embodiment, the PN junctions formed among the plurality of alternately disposed first-conductivity-type doped zones $109_1$ and second-conductivity-type doped zones $109_2$ are disposed in the middle portion $102_3$ of the ESD protection structure 102.

Figure 6H:
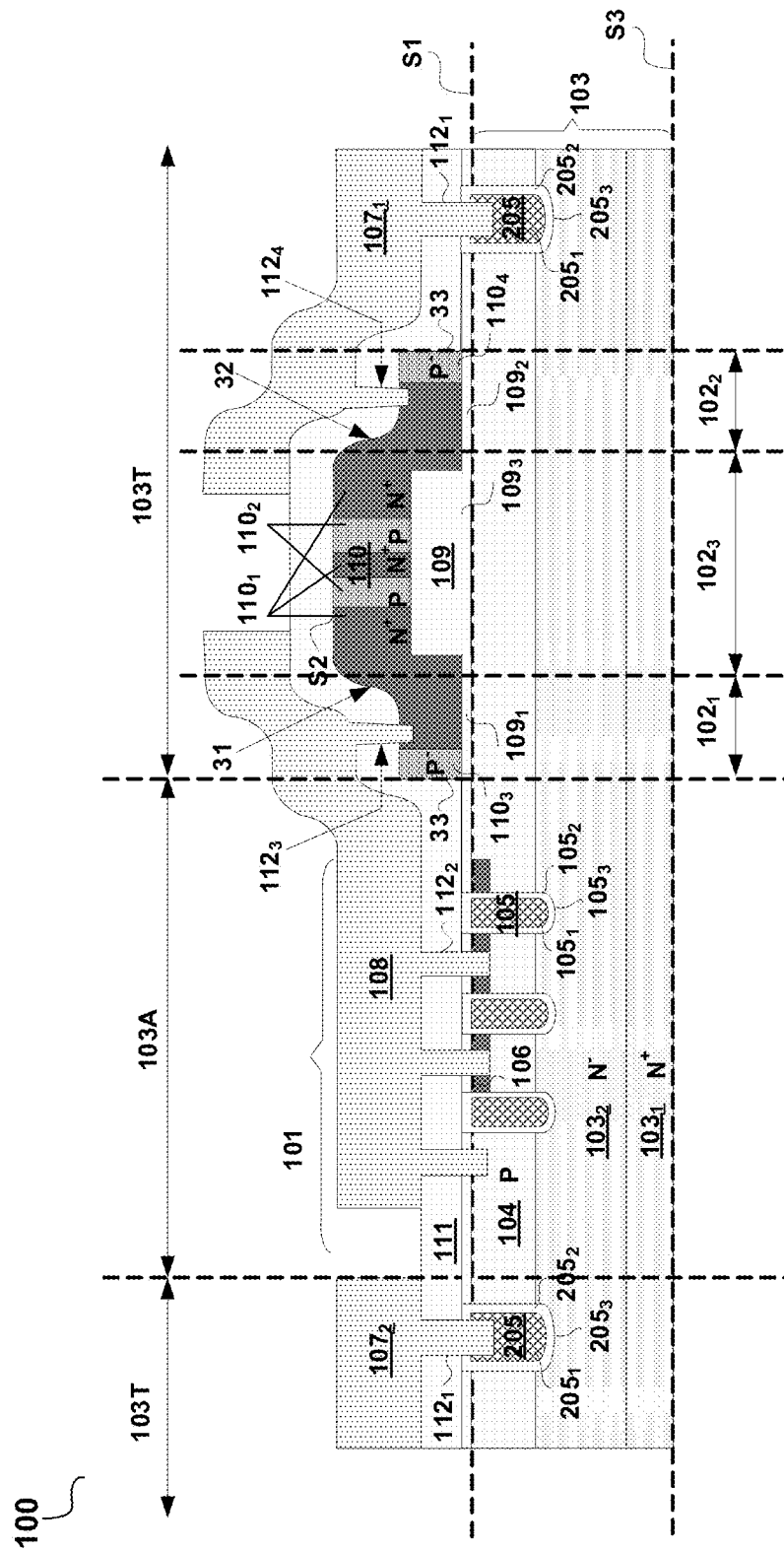

Now referring to FIG. 6H, a second isolation layer 111 (an ILD layer) is formed atop the ESD protection structure 102 and the substrate 103, and a first plurality of vias $111_1$, a second plurality of vias $112_2$, a third plurality of vias $112_3$ and a fourth plurality of vias $112_4$ are formed in the second isolation layer 111. The first plurality of vias $112_1$ is disposed over the trenched gate contacts 205. The second plurality of vias $112_2$ are located over the source regions 106. The third plurality of vias $112_3$ are disposed over the first portion $102_1$ (e.g. over the outermost first-conductivity-type doped zone $110_1$) of the ESD protection structure 102. The fourth plurality of vias $112_4$ are disposed over the second portion $102_2$ (e.g. over the innermost first-conductivity-type doped zone $110_1$) of the ESD protection structure 102. In the following, a gate metal 107 and a source metal 108 are formed respectively over the termination area 103T and the active cell area 103A atop the second isolation layer 111, wherein the gate metal 107 and the source metal 108 are separated with a gap, and the gate metal 107 is substantially around outside of the source metal 108. The gate metal 107 is formed to include a gate metal pad $107_1$ and a gate metal runner $107_2$ (further referring to the cross-sectional view of FIG. 2 and the top plan view of FIG. 3). In an embodiment, wherein the gate metal pad $107_1$ is substantially surrounded by the ring shaped ESD protection structure 102 in top plan view. In cross-sectional view, the ESD protection structure 102 is substantially between the source metal 108 and the gate metal pad $107_1$, the first portion $102_1$ of the ESD protection structure is adjacent to the source metal 108 and the second portion $102_2$ of the ESD protection structure 102 is adjacent to the gate metal pad $107_1$. The source metal 108 has a portion overlapped with the first portion $102_1$ of the ESD protection structure 102 so that the outermost first-conductivity-type doped zone $110_1$ (which is located furthest to the gate metal pad $107_1$) is electrically coupled to the source metal 108 through the third plurality of vias $112_3$. The gate metal pad $107_1$ has a portion overlapped with the second portion $102_2$ of the ESD protection structure 102 so that the innermost first-conductivity-type doped zone $110_1$ (which is located closest to the gate metal pad $107_1$) is electrically coupled to the gate metal pad $107_1$ through the fourth plurality of vias $112_4$. Further more, both the gate metal runner $107_2$ and the gate metal pad $107_1$ are electrically coupled to the trenched gate contacts 205 through the first plurality of vias $112_1$, and thus are electrically coupled to the gate regions 105. The source metal 108 is electrically coupled to the source regions 106 through the second plurality of vias $112_2$.

In accordance with an exemplary embodiment of the present invention, referring back to FIG. 6G, the designed pattern of the patterned source implantation mask layer may be modified so that after the first-conductivity-type dopants implantation, the ESD polysilicon layer 110 further includes a first floating doped zone $110_3$ and a second floating doped zone $110_4$. The first floating doped zone $110_3$ (e.g. illustrated as a first P⁻ type doped zone in FIG. 6G) is formed at the outer side edge of the ESD protection structure 102, e.g. disposed surrounding and next to the outermost first-conductivity-type doped zone $110_1$. The second floating doped zone $110_4$ (e.g. illustrated as a second P⁻ type doped zone in FIG. 6G) is formed at the inner side edge of the ESD protection structure 102, e.g. disposed next to and surrounded by the innermost first-conductivity-type doped zone $110_1$.

Methods and processes/steps of forming the semiconductor device 100 having the ESD protection structure 102 described above with reference to FIGS. 6A to 6H according to the various embodiments of the present invention are illustrative and not intended to be limiting. Well known manufacturing steps, processes, materials and dopants etc. are not described in detail to avoid obscuring aspects of the technology. Those skilled in the art should understand that the processes/steps described in the embodiments shown may be implemented in different orders and are not limited to the embodiments described. Various modifications to the processes/steps described above are possible.

Although methods and processes of forming a semiconductor device having an ESD protection structure are illustrated and explained based on forming the semiconductor device 100 comprising an N-channel MOSFET 101 and an ESD protection structure 102 on the semiconductor substrate 103 of N type, this is not intended to be limiting, and persons of ordinary skill in the art will understand that the methods, processes, structures and principles taught herein may apply to any other fabrication processes for forming semiconductor devices having the ESD protection structure disclosed in various embodiments of the present invention.

From the foregoing, it will be appreciated that specific embodiments of the present invention have been described herein for purposes of illustration, but that various modifications may be made without deviating from the spirit and scope of various embodiments of the present invention. Many of the elements of one embodiment may be combined with other embodiments in addition to or in lieu of the elements of the other embodiments. Accordingly, the present invention is not limited except as by the appended claims.

We claim:

1. A semiconductor device comprising:
    a semiconductor substrate of a first conductivity type and having an active cell area and a termination area;
    a semiconductor transistor, formed in the active cell area and having a drain region, a gate region, and a source region;
    a source metal, formed over the active cell area of the substrate and electrically coupled to the source region;
    a gate metal, formed over the termination area of the substrate and electrically coupled to the gate region, wherein the gate metal is formed around the source metal and is separated from the source metal with a gap; and
    an ESD protection structure, formed atop the termination area of the semiconductor substrate and disposed substantially between the source metal and the gate metal, wherein the ESD protection structure comprises a first isolation layer and an ESD protection layer, and wherein the first isolation layer is disposed between the ESD protection layer and the substrate to isolate the ESD protection layer from the substrate; and
    wherein the ESD protection structure has a first portion adjacent to the source metal, a second portion adjacent to the gate metal and a middle portion between and connecting the first portion and the second portion, wherein the middle portion has a greater thickness than a thickness at any point along the first portion and the second portion.

2. The semiconductor device of claim 1, wherein
    the first isolation layer comprises a first thin isolation portion, a second thin isolation portion and a thick middle isolation portion between and connecting the first thin isolation portion and the second thin isolation portion, and wherein the first thin isolation portion, the second isolation portion and the thick middle isolation portion are respectively located in the first portion, the second portion and the middle portion of the ESD protection structure, and wherein the thick middle isolation portion has a greater thickness than that of the first and the second thin isolation portions.

3. The semiconductor device of claim 1, wherein the ESD protection layer has a plurality of alternately arranged first-conductivity-type doped zones and second-conductivity-type doped zones, wherein the second-conductivity-type is opposite to the first-conductivity-type.

4. The semiconductor device of claim 3, wherein the plurality of first-conductivity-type doped zones and second-conductivity-type doped zones comprise a first-conductivity-type middle doped zone, and a plurality of second-conductivity-type doped zones and first-conductivity-type doped zones arranged alternately from both sides of the middle doped zone towards both an inner side and an outer side of the ESD protection layer, and wherein the middle doped zone is disposed at the middle of the middle portion of the ESD protection structure.

5. The semiconductor device of claim 3, wherein PN junctions formed by the plurality of first-conductivity-type doped zones and second-conductivity-type doped zones are disposed in the middle portion of the ESD protection structure.

6. The semiconductor device of claim 1, wherein the ESD protection layer further comprises:
   a first floating doped zone disposed at an outer side edge of the ESD protection structure, wherein the outside edge is adjacent to the source metal, and wherein the first floating doped zone is electrically floating;
   a second floating doped zone disposed at an inner side edge of the ESD protection structure, wherein the inner side edge is adjacent to the gate metal, and wherein the second floating doped zone is electrically floating.

7. The semiconductor device of claim 1, further comprising:
   an interlayer dielectric layer formed atop the ESD protection structure and the substrate to separate the source metal and the gate metal from the ESD protection structure and the substrate;
   a first plurality of vias formed in a portion of the interlayer dielectric layer directly overlying the first portion of the ESD protection structure to electrically couple the ESD protection structure to the overlying source metal; and
   a second plurality of vias formed in a portion of the interlayer dielectric layer directly overlying the second portion of the ESD protection structure to electrically couple the ESD protection structure to the overlying gate metal.

8. The semiconductor device of claim 1, wherein the gate metal includes a gate metal pad and a gate metal runner, and wherein the first isolation layer and the ESD protection layer of the ESD protection structure are of ring shape and are formed substantially surrounding the gate metal pad.

9. The semiconductor device of claim 1, wherein
   the gate metal includes a gate metal pad and a gate metal runner; and wherein
   the gate region of the semiconductor transistor includes a trenched gate region, wherein the trenched gate region tunnels through a portion of the substrate beneath the ESD protection structure to reach a portion of the substrate under the gate metal pad; and wherein
   the semiconductor device further comprises a trenched gate contact formed in the portion of the substrate underlying the gate metal pad, wherein the trenched gate contact connects to the trenched gate region to electrically couple the gate region to the gate metal pad.

* * * * *